Oct. 17, 1950 L. R. GOLLADAY 2,526,347
METHOD OF AND MEANS FOR PRODUCING FREQUENCY MODULATION
Filed Sept. 30, 1947
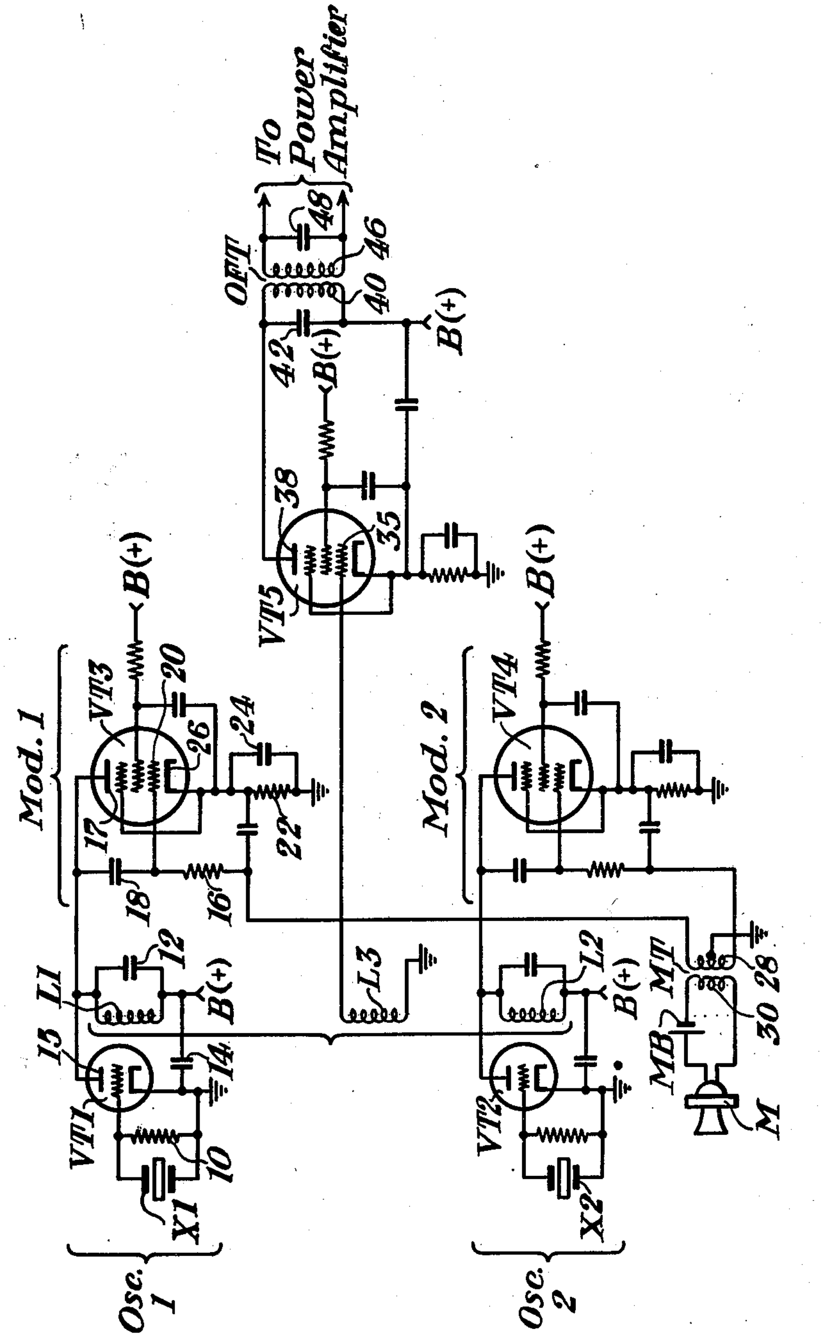
INVENTOR.
Lawrence R. Golladay
BY
[signature]
HIS ATTORNEY Patented Oct. 17, 1950 2,526,347

UNITED STATES PATENT OFFICE 2,526,347

METHOD OF AND MEANS FOR PRODUCING FREQUENCY MODULATION

Lawrence R. Golladay, Forest Hills, Pa., assignor to The Union Switch & Signal Company, Swissvale, Pa., a corporation of Pennsylvania Application September 30, 1947, Serial No. 776,899

2 Claims. (Cl. 332—23)

My invention relates to a method of and means for producing frequency modulation, and particularly to an improved method of frequency modulating a crystal-controlled low frequency communication transmitter.

It is well known in the art that a crystal-controlled oscillator provides a substantially stable source of relatively high frequency alternating current.

Such crystal-controlled oscillators are capable of having their frequency slightly deviated from their normal frequency by changing the resonant frequency of the circuit, but the deviation so produced is very small, being of the order of 2 to 5 parts in 10,000. It will be apparent that in a crystal-controlled oscillator designed to have a low normal frequency, for example, 100 kc., the maximum deviation which could be obtained would be of the order of 20 to 50 cycles, which value is far below that required for obtaining practical frequency modulation, for example, 3 kc.

Accordingly, it is an object of my invention to provide an improved method of providing frequency modulation of the energy output of a low frequency communication transmitter in which the center frequency may be held substantially stable.

A further object of my invention is to provide a crystal-controlled low frequency communication transmitter which incorporates novel means for frequency modulation of the energy output of the transmitter.

Another object of my invention is to provide an improved method of and means for producing frequency modulation.

Other objects of my invention and features of novelty will be apparent from the following description taken in connection with the accompanying drawing.

In practicing my invention, I provide a transmitter including a first and a second crystal-controlled oscillator having different relatively high oscillation frequencies, each oscillator having associated therewith a reactance tube modulator. The modulation frequency is supplied to each of the reactance tube modulators and is arranged so that the first and second oscillators are modulated by energy of opposite polarity. The oscillators are selected so that the difference between their normal frequencies represents the center frequency of the transmitter, and the output of each of the oscillators is supplied to a mixer tube. As is well known in the art, when two different frequencies are supplied to a non-linear device, the output of the device will include the beat or heterodyne frequency equal to the difference between the two frequencies supplied thereto, which beat frequency may be supplied to other devices through a band pass filter which is designed to pass frequencies of the order of the beat frequency only. It will be apparent, therefore, that the output of the mixer tube will have a center frequency corresponding to the difference between the center frequencies of the two oscillators.

When modulation energy is supplied to the reactance tube modulators, the frequency of each of the oscillators is varied in opposite directions, so that the output frequency of the mixer tube is varied by twice the amount of variation of each oscillator frequency and in accordance with the modulation frequency.

I shall describe one form of apparatus embodying my invention, and shall then point out the novel features thereof in claims.

The accompanying drawing is a diagrammatic view showing a preferred embodiment of my invention, and referring thereto, there is disclosed therein the essential elements of a communication transmitter. That is, the portion of the equipment including the radio frequency generating apparatus and the modulation apparatus is shown, while the power amplifier and other apparatus associated with the output stage of the transmitter has not been shown since the output stage forms no part of my invention. In the drawing, the heaters of the various vacuum tubes have been omitted, in order to simplify the drawing. Also, high voltage direct current is supplied to the various parts of the equipment from a source, not shown, whose positive terminal is designated by the reference character B(+) and whose negative terminal is grounded.

As shown, an oscillator OSC1 comprises a vacuum tube VT1 provided with a crystal-controlled grid circuit including a crystal X1 and grid leak resistor 10. The output circuit of tube VT1 includes a resonant tank circuit comprising an inductance L1 and a condenser 12, while a bypass condenser 14 affords a return path for the high frequency alternating current in the output circuit of tube VT1. Positive high voltage energy is supplied from terminal B(+) to plate 15 of tube VT1 through the inductance L1 in the oscillator tank circuit. Such a type of crystal-controlled oscillator is well known in the art and a detailed description of its construction and operation is considered unnecessary, it being deemed sufficient to point out that the crystal X1 is selected for a predetermined natural frequency and the tank circuit including inductance L1 and condenser 12 is tuned to substantially the same frequency. As a result, the oscillator OSC1 will oscillate at a predetermined center frequency and will remain stable at that frequency and, in accordance with the characteristics of such oscillators, will not be seriously affected by external variations in voltage or temperature. For purposes of illustration, it will be assumed that oscillator OSC1 is constructed and arranged to oscillate at a center frequency of 7100 kc. and that the properties of the crystal are such that a deviation in the tuning of the tank circuit will produce a deviation of 1.5 kc. above and below the center frequency of 7100 kc.

Such deviation in the tuning of the oscillator OSC1 may be produced by the operation of a modulator MOD1, which as here shown, is of the well-known reactance tube type and comprises a tube VT3, having its plate 17 connected to the positive high voltage source B(+) through the inductance L1 and having a condenser 18 and a resistor 16 connected across its plate and cathode. A control grid 20 of the tube VT3 is connected to the junction terminal of condenser 18 and resistor 16, and cathode 26 is connected to ground through a cathode dropping resistor 22 having a cathode by-pass condenser 24 connected in multiple therewith. The components are selected and arranged so that the tube VT1 acts as an additional reactance in multiple with the tank circuit of oscillator OSC1. If the plate current of tube VT3 is varied by varying the biasing voltage of the grid 20, the effective reactance of the oscillator tank circuit is changed proportionately, and thereby causes a small change in the frequency of the oscillator OSC1. The biasing voltage for the control grid 20 of tube VT3 is derived by means of the cathode dropping resistor 22 and by-pass condenser 24.

Thus the flow of plate current through the resistor 22 will cause a voltage drop across resistor 22, by which the cathode 26 of the tube VT3 is at a higher positive potential than ground. The grid 20 of tube VT3 is connected to ground through the resistor 16 and the upper half of a center tapped secondary winding 28 of a modulation transformer MT. The modulation transformer MT has a primary winding 30 which is connected in series with a battery MB and a microphone M. It will be apparent that changes in the current flowing through the primary winding 30 of transformer MT as a result of sound impressed upon the microphone M will cause alternating current to be induced in the secondary winding of transformer MT. Accordingly, normally a predetermined bias voltage is provided for the grid 20 of tube VT3 by means of the cathode dropping resistor 22, and the alternating current energy induced in the secondary winding 28 of transformer MT will cause a proportional change in the bias voltage supplied to the grid 20 of tube VT3, and as a result of the fluctuations of the bias voltage the plate current through the tube VT3 changes in accordance with the change in the bias voltage. It follows that the reactance of tube VT3 is changed in accordance with the changes in the bias voltage, and results in a change in the tuning of the resonant tank circuit of the oscillator OSC1, so that the frequency of the oscillator OSC1 is varied in accordance with the changes in the reactance of the tube VT3. It will be seen, therefore, that the frequency of the oscillator OSC1 is deviated from the normal frequency or mean frequency in accordance with the modulation energy supplied through the modulation transformer MT.

The oscillator OSC2 is constructed and arranged in a manner similar to that previously described for oscillator OSC1, except that the frequency of oscillator OSC2 differs from the frequency of oscillator OSC1 by a frequency which is equal to the frequency of the transmitter. For example, since it has been assumed that the frequency of the oscillator OSC1 is 7100 kc., and if it is assumed that the frequency of the transmitting equipment is to be 100 kc., then the oscillator OSC2 will be arranged and constructed to generate a normal frequency of 7000 kc. As a result the difference between the normal frequencies of oscillator OSC1 and oscillator OSC2 is 100 kc. which is the mean or center frequency of the transmitter. The modulator MOD2 is constructed and arranged in a manner similar to that shown and described for modulator MOD1, and functions in a similar manner, except that the grid circuit for the tube VT4 is carried through the lower half of the secondary winding 28 of transformer MT. Accordingly, it will be seen that the grid bias voltage supplied to modulator MOD1 and modulator MOD2 from the modulation transformer MT differs in polarity, and when the grid bias voltage of modulator MOD1 is driven in the positive direction by the energy induced in the secondary winding 28 of transformer MT, the grid bias voltage of modulator MOD2 is driven in the negative direction by an equal amount, so that when the frequency of oscillator OSC1 is varied in one direction, the frequency of oscillator OSC2 is varied a similar amount but in the opposite direction, and vice versa.

From the foregoing it will be seen that the oscillators OSC1 and OSC2 operate at normal frequencies having a difference of 100 kc. When the microphone M picks up sound waves, the bias voltages of the modulators MOD1 and MOD2 are changed but with opposite polarity, so that the frequencies of the oscillators OSC1 and OSC2 change in opposite directions.

This change in frequency will become apparent from the following example. If, as previously stated, the normal or mean frequency of oscillator OSC1 is 7100 kc., and the normal or mean frequency of oscillator OSC2 is 7000 kc., then the difference between these frequencies is 100 kc. Assuming that each of the oscillators has a maximum frequency deviation of 1.5 kc. above and below the normal frequency, then when the modulation energy supplied through the modulation transformer MT causes the frequency of oscillator OSC1 to be deviated in a positive direction to its maximum value of deviation and the frequency of oscillator OSC2 to be deviated in a negative direction to its maximum value of deviation the difference between the frequencies of the two oscillators is then:

$$(7100+1.5)-(7000-1.5)=103 \text{ kc.}$$

Similarly, when the modulation energy causes the frequency of oscillator OSC1 to be deviated in a negative direction to its maximum value of deviation and the frequency of oscillator OSC2 to be deviated in a positive direction to its maximum value of deviation, the difference between the frequencies of the two oscillators is then:

$$(7100-1.5)-(7000+1.5)=97 \text{ kc.}$$

Accordingly, the difference between the frequencies of the two oscillators is first increased 3 kc., and then decreased 3 kc., with respect to its normal frequency of 100 kc., so that there is provided a maximum frequency deviation of 3 kc. It is to be understood that the frequencies employed are only representative, and my invention is not limited to these frequencies.

Although it has been shown that the beat frequency equal to the difference between the frequencies of the oscillators OSC1 and OSC2 is the relatively low mean or center frequency which is desired, and is capable of being deviated as a result of the deviation of the frequencies of the oscillators, it is necessary to extract this mean or center frequency so that it may be supplied to the output stage or stages of the transmitter, and such extraction will now be described.

An inductance L3 is inductively coupled to the inductance L1 of oscillator OSC1 and inductance L2 of oscillator OSC2, so that the high frequency energy in the inductances L1 and L2 causes energy to be induced in the inductance L3, which energy is supplied to the grid 35 of a mixer tube VT5. Accordingly, the energy supplied to the grid of the mixer tube comprises energy having the frequency of oscillator OSC1 and energy having the frequency of oscillator OSC2. The mixer tube VT5 is here shown as a pentode tube arranged in a conventional amplifier circuit. As is well known in the art, when two different frequencies are supplied to the input of a non-linear device, the output of the device will contain each of the input frequencies, a beat frequency equal to the sum of the input frequencies, and a beat frequency equal to the difference between the input frequencies.

The plate 38 of tube VT5 has in its circuit an output transformer OFT which is of the tuned primary-tuned secondary type in which the primary winding 40 and the condenser 42 are tuned to resonance at a particular frequency, and the secondary winding 46 and condenser 48 are tuned to resonance at the same frequency as the primary. It will be apparent that if the transformer OFT is tuned so that it will pass frequencies of the order of the difference beat frequency of the oscillators, the other frequencies will not be passed by the transformer OFT.

From the foregoing it will be seen that the frequencies generated by the oscillators OSC1 and OSC2 are mixed in the mixer tube VT5, and of the resulting frequencies, only the beat frequency equal to the difference between the two oscillator frequencies is passed by the output transformer OFT. The secondary winding of transformer OFT may then be coupled to the output stage or stages of the transmitter. It is to be understood that the tuning of the output transformer OFT is made sufficiently broad to pass the frequencies corresponding to the maximum deviation of the mean or center frequency. For example, if the mean or center frequency is 100 kc., with a maximum frequency deviation of 3 kc., as determined in the previous example, then the transformer OFT would be tuned to pass frequencies between 97 kc. and 103 kc. inclusive, and would attenuate frequencies outside these limits.

My invention is advantageous in the respect that it makes possible a low frequency crystal-controlled transmitter, in which the center frequency is held substantially stable, and yet allows a frequency deviation which will produce good modulation.

It is to be understood that my invention is not limited to the specific arrangement shown in the drawing, since any type of crystal oscillator may be used, and additionally the modulation of the oscillator may be accomplished in ways other than by the use of the reactance tube type modulation. It will be apparent to those skilled in the art that the output of the oscillators OSC1 and OSC2 may be amplitude modulated by any of the well-known methods to produce an amplitude modulated beat frequency. Also, it will be apparent to those skilled in the art that a mixer tube of the multiple grid type may be used, in which each of the control grids may be coupled by means of resistance-capacity coupling to each of the oscillator circuits, such arrangements being well known in the art.

Although I have herein shown and described only one method of and means for producing frequency modulation embodying my invention, it is understood that various changes and modifications may be made therein within the scope of the appended claims without departing from the spirit and scope of my invention.

Having thus described my invention, what I claim is:

1. In transmitting apparatus for communication systems, the combination comprising, a pair of oscillators preselected to oscillate at different high frequencies, a mixing circuit including a non-linear device for obtaining the beat frequency equal to the difference between said high frequencies, modulating means for each of said oscillators including a reactance tube and a source of audio frequency energy for frequency modulating said high frequencies, and an output means coupled to said mixing means and broadly tuned to said beat frequency for transmitting the frequency modulated beat frequency energy.

2. In transmitting apparatus for communication systems, the combination comprising, a first crystal-controlled oscillator operating at a first preselected high frequency, a second crystal-controlled oscillator operating at a second preselected high frequency, each of said oscillators having a predetermined frequency deviation above and below said preselected high frequencies, mixing means including a non-linear device for obtaining the beat frequencies equal to the sum and difference of said first and second high frequencies, output means coupled to said mixing means and broadly tuned to the beat frequency equal to the difference between said high frequencies, modulating means for each of said oscillators including a reactance tube, and means including a source of audio frequency energy for oppositely varying the reactance of said reactance tubes, whereby the frequencies of said oscillators are oppositely varied within said predetermined frequency variation to thereby produce frequency modulation of said beat frequencies.

LAWRENCE R. GOLLADAY.

REFERENCES CITED

The following references are of record in the file of this patent:

UNITED STATES PATENTS

| Number | Name | Date |
|---|---|---|
| 2,030,090 | Baruch | Feb. 11, 1936 |
| 2,240,450 | Wolfskill | Apr. 29, 1941 |
| 2,304,388 | Usselman | Dec. 8, 1942 |
| 2,309,083 | Usselman | Jan. 26, 1943 |
| 2,355,433 | Goldstine | Aug. 8, 1944 |
| 2,375,527 | Crosby | May 8, 1945 |
| 2,390,777 | Cole | Dec. 11, 1945 |
| 2,458,760 | Andersen | Jan. 11, 1949 |